United States Patent [19]

Yukawa et al.

[11] Patent Number: 5,288,588
[45] Date of Patent: Feb. 22, 1994

[54] POSITIVE PHOTOSENSITIVE POLYIMIDE RESIN COMPOSITION COMPRISING AN O-QUINONE DIAZIDE AS A PHOTOSENSITIVE COMPOUND

[75] Inventors: Masahiko Yukawa; Toyohiko Abe; Noriaki Kohtoh, all of Funabashi, Japan

[73] Assignee: Nissan Chemical Industries Ltd., Tokyo, Japan

[21] Appl. No.: 983,605

[22] Filed: Nov. 30, 1992

Related U.S. Application Data

[63] Continuation of Ser. No. 602,814, Oct. 24, 1990, abandoned.

[30] Foreign Application Priority Data

Oct. 27, 1989 [JP] Japan ................... 1-281337

[51] Int. Cl.$^5$ .................... G03F 7/023; G03F 7/32
[52] U.S. Cl. .................... 430/192; 430/165; 430/191; 430/193; 430/326; 430/905
[58] Field of Search ............ 430/191, 192, 193, 165, 430/326, 905

[56] References Cited

U.S. PATENT DOCUMENTS

| | | | |
|---|---|---|---|
| 4,366,304 | 12/1982 | Nimry et al. | 528/188 |
| 4,657,832 | 4/1987 | Pfeifer | 430/270 |
| 4,698,295 | 10/1987 | Pfeifer et al. | 430/325 |
| 4,877,718 | 10/1989 | Moore et al. | 430/283 |
| 4,927,736 | 5/1990 | Mueller et al. | 430/192 |
| 5,057,399 | 10/1991 | Flaim et al. | 430/330 |

FOREIGN PATENT DOCUMENTS

| | | |
|---|---|---|
| 0379639 | 4/1973 | European Pat. Off. . |
| 0378156 | 3/1979 | European Pat. Off. . |
| 0300326 | 7/1981 | European Pat. Off. . |

Primary Examiner—Lee C. Wright
Assistant Examiner—John S. Chu
Attorney, Agent, or Firm—Oblon, Spivak, McClelland, Maier & Neustadt

[57] ABSTRACT

A positive photosensitive polyimide resin composition which comprises 100 parts by weight of an organic solvent-soluble polyimide resin and 1-100 parts by weight of an o-quinonediazide compound, said polyimide resin being composed of the repeating units represented by formulas [I] and [II] below

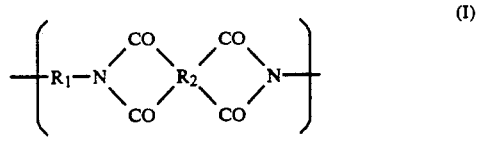

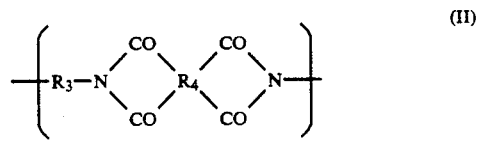

(where $R_1$ is a divalent organic group to constitute a diamine which has one or more groups of at least one kind selected from the group consisting of phenolic hydroxyl group, carboxyl group, thiophenol group, and sulfonic group; $R_3$ is a divalent organic group having no phenolic hydroxyl group, carboxyl group, thiophenol group, and sulfonic group; and $R_2$ and $R_4$ each are a tetravalent organic group constituting a-tetracarboxylic acid and a derivative thereof when $R_1$ has one or more groups of at least one kind selected from the group consisting of carboxyl group and sulfonic group and has no phenolic hydroxyl group and thiophenol group, or $R_2$ and $R_4$ each are a tetravalent organic group constituting a tetracarboxylic acid and a derivative thereof composed of four carbonyl groups which are not attached directly to the aromatic ring when $R_1$ has a phenolic hydroxyl group and/or thiophenol group) with the molar percentage (a) of the repeating units represented by formula [I] being in the range of 1 mol % $\leq a \leq 90$ mol % and the molar percentage (b) of the repeating units represented by formula [II] being in the range of 10 mol % $\leq b \leq 99$ mol %, and having a reduced viscosity of 0.05-3.0 dl/g (measured at a concentration of 0.5 g/l in N-methylpyrrolidone at 30° C.).

15 Claims, No Drawings

POSITIVE PHOTOSENSITIVE POLYIMIDE RESIN COMPOSITION COMPRISING AN O-QUINONE DIAZIDE AS A PHOTOSENSITIVE COMPOUND

This application is a continuation of application Ser. No. 07/602,814, filed on Oct. 24, 1990, now abandoned.

The present invention relates to a new positive photosensitive polyimide resin composition suitable for electric and electronic devices, especially semiconductor devices.

Polyimide resin has an advantage of being superior in mechanical strength, electrical insulating properties, and heat resistance. Owing to its good electrical properties and heat resistance, polyimide resin is being applied to semiconductor devices which need the maximum reliability.

The applications of polyimide resin to semiconductor devices include junction coating film, moisture proof film, buffer coating film, α-ray shielding film, and layer insulating film. [See "Kinou Zairyo" (Functional Materials), July 1983, p. 9.]

Polyimide resin film in these applications needs minute fabrication (such as through holes) for the connection of upper and lower conductor layers and for the connection to external lead wires. To this end, polyimide resin film usually undergoes chemical etching that employs a photoresist. The chemical etching process needs the patterning of polyimide resin film which includes the steps of applying and removing the photoresist. These steps are very complex as a whole. To simplify the steps, there has arisen a demand for a polyimide resin which can undergo minute fabrication directly with light.

There are several methods for making polyimide resins photosensitive. The one disclosed in Japanese Unexamined Patent Publication Nos. 116216/1979 and 116217/1979 consists of binding a crosslinkable group to a soluble precursor. The one disclosed in Japanese Unexamined Patent Publication Nos. 145794/1979 and 168942/1982 consists of incorporating a crosslinkable monomer.

The above-mentioned methods are designed for negative, in which case the exposed part becomes insoluble due to crosslinking by light and the unexposed part remains soluble in the developing solution. They consist of making the polyimide precursor photosensitive (taking advantage of it being soluble in solvents), exposing the precursor to light for fabrication, and heating the exposed precursor for imide ring closure. A disadvantage of negative is that the exposed part is swollen by the developing solution and this presents difficulties in minute fabrication with a high resolution.

Another serious disadvantage of the above-mentioned methods is that the imide ring closure, which is performed after fabrication by light, brings about dehydration which, in conjunction with the evaporation of crosslinkable components, causes volume shrinkage, which in turn leads to the reduction of film thickness and the decrease in dimensional accuracy.

Another method for making polyimide resins photosensitive, which is disclosed in Japanese Unexamined Patent Publication Nos. 13032/1988 and 60630/1989, consists of incorporating an organic solvent-soluble polyimide resin with a photosensitive substance such as o-quinonediazide compound. This method is designed for positive, in which case the exposed part becomes soluble in the developing solution due to photodecomposition. This method is based on the principle that although the polyimide resin itself is not photosensitive, the photosensitive substance becomes alkali-soluble upon exposure and it is dissolved in an alkali together with the polyimide resin.

A disadvantage of the first method (disclosed in Japanese Unexamined Patent Publication No. 13032/1988) is that the polyimide resin is so poor in solubility in an alkali that it has to be heated for alkali development. This considerably reduces the film thickness of the unexposed part, adversely affecting the dimensional accuracy and preventing the good patterning.

To increase the solubility of polyimide resin in an alkali, an attempt has been made in the second method (disclosed in Japanese Unexamined Patent Publication No. 60630/1989) by introducing hydroxyl groups into the skeleton of polyimide resin. Unfortunately, this attempt is not successful because the resulting polyimide resin does not have a sufficiently high light transmittance. This reduces the sensitivity of the photosensitive substance and hence makes it necessary to add a large amount of photosensitive substance to differentiate the exposed part from the unexposed part in solubility. Moreover, the resulting polyimide resin is slow in dissolution.

In the meantime, the production of polyimide resin involves the ring closure of polyamic acid (precursor) through dehydration. The simplest method for dehydration is the so-called catalytic imidization process which employs a dehydrating agent (such as acetic anhydride) in combination with a tertiary amine (such as pyridine). Unfortunately, the catalytic imidization is not practicable for the polyimide resin having hydroxyl groups because acetic anhydride reacts with hydroxyl groups in the polymer main chain.

As mentioned above, all the attempts made so far to make polyimide resins photosensitive were unsuccessful.

In order to address the above-mentioned problems, the present inventors carried out extensive studies, which led to the present invention. The gist of the present invention resides in:

(1) A positive photosensitive polyimide resin composition which comprises 100 parts by weight of an organic solvent-soluble polyimide resin and 1–100 parts by weight of an o-quinonediazide compound, said polyimide resin being composed of the repeating units represented by formulas [I] and [II] below

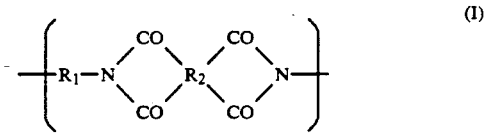

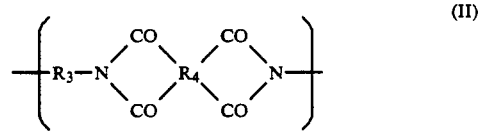

(where $R_1$ is a divalent organic group to constitute a diamine which has one or more groups Of at least one kind selected from the group consisting of phenolic hydroxyl group, carboxyl group, thiophenol group, and sulfonic group; $R_3$ is a divalent organic group having no phenolic hydroxyl group, carboxyl group, thiophenol group, and sulfonic group; and $R_2$ and $R_4$ each are a tetravalent organic group constituting a tetracarboxylic acid and a derivative thereof when $R_1$ has one or more groups of at least one kind selected from the group consisting of carboxyl group and sulfonic group and has no phenolic hydroxyl group and thiophenol group, or $R_2$ and $R_4$ each are a tetravalent organic group constituting a tetracarboxylic acid and a derivative thereof composed of four carbonyl groups which are not attached directly to the aromatic ring when $R_1$ has a phenolic hydroxyl group and/or thiophenol group) with the molar percentage (a) of the repeating units represented by formula [I] being in the range of 1 mol % $\leq a \leq 90$ mol % and the molar percentage (b) of the repeating units represented by formula [II] being in the range of 10 mol % $\leq b \leq 99$ mol %, and having a reduced viscosity of 0.05–3.0 dl/g (measured at a concentration of 0.5 g/dl in N-methylpyrrolidone at 30° C.).

(2) A positive photosensitive polyimide resin composition as described in part 1 above, wherein the polyimide resin is composed of the repeating units represented by formulas [I] and [II] in which $R_1$ is a divalent organic group having one or more groups of at least one kind selected from the group consisting of carboxyl group and sulfonic group and having no phenolic hydroxyl group and thiophenol group; and $R_2$ and $R_4$ each are a tetravalent organic group which has at least one aromatic ring and constitutes a tetracarboxylic acid and a derivative thereof, with the four carbonyl groups being attached to the individual carbon atoms of the aromatic ring.

(3) A positive photosensitive polyimide resin composition as described in part 1 above, wherein the polyimide resin is composed of the repeating units represented by formulas [I] and [II] in which $R_1$ is a divalent organic group to constitute a diamine which has one or more groups of at least one kind selected from the group consisting of phenolic hydroxyl group, carboxyl group, thiophenol group, and sulfonic group; $R_3$ is a divalent organic group having no phenolic hydroxyl group, carboxyl group, thiophenol group, and sulfonic group; and $R_2$ and $R_4$ each are a tetravalent organic group which constitutes a tetracarboxylic acid and a derivative thereof composed of four carbonyl groups which are not attached directly to the aromatic ring.

(4) A positive photosensitive polyimide resin composition as described in part 3 above, wherein the polyimide resin composed of the repeating units represented by formulas [I] and [II] is an organic solvent-soluble polyimide resin which has a transmittance higher than 80% for light having a wavelength of 350 nm when it is in the form of 5-μm thick film.

(5) A positive photosensitive polyimide resin composition as noted in part 4 above, wherein the polyimide resin is composed of the repeating units represented by formulas [I] and [II], with the molar percentage (a) of the repeating units represented by formula [I] being in the range of 5 mol % $\leq a \leq 50$ mol % and the molar percentage (b) of the repeating units represented by formula [II] being in the range of 50 mol % $\leq b \leq 95$ mol %.

(6) A positive photosensitive polyimide resin composition as described in part 4 above, wherein the polyimide resin is composed of the repeating units represented by formulas [I] and [II], with the molar percentage (a) of the repeating units represented by formula [I] being in the range of 5 mol % $\leq a \leq 20$ mol % and the molar percentage (b) of the repeating units represented by formula [II] being in the range of 80 mol % $\leq b \leq 95$ mol %.

(7) A positive photosensitive polyimide resin composition as described in part 4 above, wherein the polyimide resin is composed of the repeating units represented by formulas [I] and [II] in which $R_2$ and $R_4$ each are a cyclobutadiene residue.

(8) A positive photosensitive polyimide resin composition as described in part 5 above, wherein the polyimide resin is composed of the repeating units represented by formulas [I] and [II] in which $R_2$ and $R_4$ each are a cyclobutadiene residue.

(9) A positive photosensitive polyimide resin composition as described in part 6 above, wherein the polyimide resin is composed of the repeating units represented by formulas [I] and [II] in which $R_2$ and $R_4$ each are a cyclobutadiene residue.

(10) A positive photosensitive polyimide resin composition as described in part 4 above, which comprises 100 parts by weight of an organic solvent-soluble polyimide resin specified in part 4 and 5–50 parts by weight of an o-quinonediazide compound.

(11) A positive photosensitive polyimide resin composition as described in part 5 above, which compsises 100 parts by weight of an organic solvent-soluble polyimide resin specified in part 5 and 5–50 parts by weight of an o-quinonediazide compound.

(12) A positive photosensitive polyimide resin composition as described in part 6 above, which comprises 100 parts by weight of an organic solvent-soluble polyimide resin specified in part 6 and 5–50 parts by weight of an o-quinonediazide compound.

(13) A positive photosensitive polyimide resin composition as described in part 7 above, which comprises 100 parts by weight of an organic solvent-soluble polyimide resin specified in part 7 and 5–50 parts by weight of an o-quinonediazide compound.

(14) A positive photosensitive polyimide resin composition as described in part 8 above, which comprises 100 parts by weight of an organic solvent-soluble polyimide resin specified in part 8 and 5–50 parts by weight of an o-quinonediazide compound.

(15) A positive photosensitive polyimide resin composition as described in part 9 above, which comprises 100 parts by weight of an organic solvent-soluble polyimide resin specified in part 9 and 5–50 parts by weight of an o-quinonediazide compound.

In other words, the present invention relates to a composition with positive photosensitive characteristics which is composed of a solvent-soluble polyimide resin having acid functional groups (such as phenolic hydroxyl group, carboxyl group, thiophenol group, and sulfonic group) and an o-quinonediazide compound.

The first object of the present invention is to provide a composition with positive photosensitive characteristics which contains as a constituent a solvent-soluble polyimide resin which can be prepared easily by the catalytic imidization.

The second object of the present invention is to provide a composition with positive photosensitive characteristics of extremely high sensitivity and high resolution which contains as a constituent an extremely transparent solvent-soluble polyimide resin.

The composition of the present invention provides a polyimide resin coating film on which a fine, accurate relief pattern is formed by exposure through a patterned mask and subsequent etching with an alkaline aqueous solution.

The polyimide resin used in the present invention may be prepared by any method which is not specifically limited. Usually, it is prepared by reacting an organic tetracarboxylic acid (or a derivative thereof) with an organic diamine, followed by polymerization. The most common process consists of reacting an organic tetracarboxylic acid dianhydride (referred to as acid anhydride hereinafter) with an organic diamine (referred to as diamine hereinafter), followed by polymerization.

The diamine having $R_1$ as a constituent in formula [I] is not specifically limited so long as it has one or more groups of at least one kind selected from the group consisting of phenolic hydroxyl group, carboxyl group, thiophenol group, and sulfonic group. They may be present alone or in combination with one another. Examples of the diamine are listed below.

Diamines having one or more phoenolic hydroxyl groups:
1,3-diamino-4-hydroxybenzene,
1,3-diamino-5-hydroxybenzene,
1,3-diamino-4,6-dihydroxybenzene,
1,4-diamino-2-hydroxybenzene,
1,4-diamino-2,5-dihydroxybenzene,
bis(3-amino-4-hydroxyphenyl)ether,
bis(4-amino-3-hydroxyphenyl)ether,
bis(4-amino-3,5-dihydroxyphenyl)ether,
bis(3-amino-4-hydroxyphenyl)methane,
bis(4-amino-3-hydroxyphenyl)methane,
bis(4-amino-3,5-dihydroxyphenyl)methane,
bis(3-amino-4-hydroxyphenyl)sulfone,
bis(4-amino-3-hydroxyphenyl)sulfone,
bis(4-amino-3,5-dihydroxyphenyl)sulfone,
2,2-bis(3-amino-4-hydroxyphenyl)propane,
2,2-bis(4-amino-3-hydroxyphenyl)propane,
2,2-bis(4-amino-3,5-dihydroxyphenyl)propane,
2,2-bis(3-amino-4-hydroxyphenyl)hexafluoropropane,
2,2-bis(4-amino-3-hydroxyphenyl)hexafluoropropane,
2,2-bis(4-amino-3,5-dihydroxyphenyl)hexafluoropropane,
4,4'-diamino-3,3'-dihydroxyphenyl,
4,4'-diamino-3,3'-dihydroxy-5,5'-dimethylbiphenyl,
4,4'-diamino-3,3'-dihydroxy-5,5'-dimethoxybiphenyl,
1,4-bis(3-amino-4-hydroxyphenoxy)benzene,
1,3-bis(3-amino-4-hydroxyphenoxy)benzene,
1,4-bis(4-amino-3-hydroxyphenoxy)benzene,
1,3 bis(4-amino-3-hydroxyphenoxy)benzene,
bis[4-(3-amino-4-hydroxyphenoxy)phenyl]sulfone,
2,2-bis[4-(3-amino-4-hydroxyphenoxy)phenyl]propane,
2,2-bis[4-(3-amino-4-hydroxyphenoxy)phenyl]hexafluoropropane.

Diamines having one or more carboxyl groups:
1,3-diamino-4-carboxybenzene,
1,3-diamino-5-carboxybenzene,
1,3-diamino-4,6-dicarboxybenzene,
1,4-diamino-2-carboxybenzene,
1,4-diamino-2,5-dicarboxybenzene,
bis(4-amino-3-carboxyphenyl)ether,
bis(4-amino-3,5-dicarboxyphenyl)ether,
bis(4-amino-3 carboxyphenyl)sulfone,
bis(4-amino-3,5-dicarboxylphenyl)sulfone,
4,4'-diamino-3,3'-dicarboxybiphenyl,
4,4'-diamino-3,3'-dicarboxy-5,5'-dimethylbiphenyl,
4,4'-diamino-3,3'-dicarboxy-5,5'-dimethoxybiphenyl,
1,4-bis(4-amino-3-carboxyphenoxy)benzene,
1,3-bis(4-amino-3-carboxyphenoxy)benzene,
bis[4-(4-amino-3-carboxyphenoxy)phenyl]sulfone,
2,2-bis[4-(4-amino-3-carboxyphenoxy)phenyl]propane,
2,2-bis[4-(4-amino-3-carboxyphenoxy)phenyl]hexafluoropropane.

Diamines having one or more thiophenol groups:
benzene-4-sulfonic acid,
1,3-diamino-4-mercaptobenzene,
1,3-diamino-5-mercaptobenzene,
1,4-diamino-2-mercaptobenzene,
bis(4-amino-3-mercaptophenyl)ether,
2,2-bis(3-amino-4-mercaptophenyl)hexafluoropropane.

Diamines having one or more sulfonic groups:
benzene-4-sulfonic acid,
1,3-diaminobenzene-5-sulfonic acid,
1,4-diaminobenzene-2-sulfonic acid,
bis(4-aminobenzene-3-sulfonic)ether
4,4'-aminobiphenyl-3,3'-disulfonic acid,
4,4'-diamino-3,3'-dimethylbiphenyl-6,6'-disulfonic acid.

Diamines having phenolic-hydroxyl group, carboxyl group, thiophenol group, and sulfonic group in combination:
bis(4-amino-3-carboxy-5-hydroxyphenyl)ether,
bis(4-amino-3-carboxy-5-hydroxyphenyl)methane,
bis(4-amino-3-carboxy-5-hydroxyphenyl)sulfone,
2,2-bis(4-amino-3-carboxy-5-hydroxyphenyl)propane,
2,2-bis(4-amino-3-carboxy-5-hydroxyphenyl)hexafluoropropane.

Diamines having a carboxyl group and/or sulfonic group are desirable because they permit easy production of the solvent-soluble polyimide resin (used for the first object of the present invention) by the catalytic imidization.

The diamine having $R_3$ as a constituent in formula [II] is not specifically limited so long as it has no phenolic hydroxyl group, carboxyl group, thiophenol group, and sulfonic group. Examples of the diamine are listed below.
4,4'-methylene-bis(2,6-diethylaniline),
4,4'-methylene-bis(2-isopropyl-6-methylaniline),
4,4'-methylene-bis(2,6-diisopropylaniline),
bis[4-(3-aminophenoxy)phenyl]solfone,
2,2-bis[4-(3-aminophenoxy)phenyl]propane,
2,2-bis[4-(3-aminophenoxy)phenyl]hexafluoropropane,
4,4'-diamino-3,3'-dimethyldicyclohexylmethane,
4,4'-diaminodiphenylether,
4,4'-diaminodiphenylmethane,
1,4-bis(4-aminophenoxy)benzene,
1,3-bis(4-aminophenoxy)benzene,
bis[4-(4-aminophenoxy)phenyl]sulfone,
2,2-bis[4-(4-aminophenoxy)phenyl]propane,
2,2-bis[4-(4-aminophenoxy)phenyl]hexafluoropropane.

The following are preferable from the standpoint of solubility of the polyimide.
4,4'-methylene-bis(2,6-diethylaniline),
4,4'-methylene-bis(2-isopropyl-6-methylaniline),
4,4-methylene-bis(2,6-diisopropylaniline),
bis[4-(3-aminophenoxy)phenyl]sulfone,
2,2-bis[4-(3-aminophenoxy)phenyl]propane,
2,2-bis[4-(3-aminophenoxy)phenyl]hexafluoropropane.

The acid anhydride containing as its constituent $R_2$ in formula [I] or $R_4$ in formula [II] is not specifically limited when the diamine containing as its constituent $R_1$ in formula [I] has one or more groups of at least one kind selected from the group consisting of carboxyl group and sulfonic group and has no phenolic hydroxyl group and thiophenol group. They may be the same or different, and may be present alone or in combination with one another. Examples of the acid anhydride include the following aromatic tetracarboxylic acid anhydrides.
pyromellitic acid dianhydride,
1,4,5,8-naphthalenetetracarboxylic acid dianhydride,
3,3',4,4'-benzophenonetetracarboxylic acid dianhydride,
3,3',4,4'-biphenyltetracarboxylic acid dianhydride,
bis(3,4-dicarboxyphenyl)ether dianhydride,
2,2-bis(3,4-dicarboxyphenyl)hexafluoropropane dianhydride,
bis(3,4-dicarboxyphenyl)sulfonic dianhydride.

Preferable among them from the standpoint of polyimide solubility are:
3,3',4,4'-benzophenonetetracarboxylic acid dianhydride,
3,3',4,4'-biphenyltetracarboxylic acid dianhydride,
2,2-bis(3,4-dicarboxyphenyl)hexafluoropropane dianhydride,
bis(3,4-dicarboxyphenyl)sulfonic dianhydride.

Additional examples of the acid anhydride include the following alicyclic tetracarboxylic acid anhydrides.
cyclobutane-1,2,3,4-tetracarboxylic acid dianhydride,
3,4-dicarboxy-1,2,3,4-tetrahydro-1naphthalenesuccinic acid dianhydride,
2,3,5-tricarboxycyclopentylacetic acid dianhydride,
bicyclo(2.2.2)oct-7-ene-2,3,5,6-tetracarboxylic acid dianhydride,
tetrahydrofuran-2,3,4,5-tetracarboxylic acid dianhydride.

Preferable among them from the standpoint of polyimide solubility are:
cyclobutane-1,2,3,4-tetracarboxylic acid dianhydride,
3,4-dicarboxy-1,2,3,4-tetrahydro-1-naphthalenesuccinic acid dianhydride,
2,3,5-tricarboxycyclopentylacetic acid dianhydride,
bicyclo(2.2.2)oct-7-ene-2,3,5,6-tetracarboxylic acid dianhydride,
tetrahydrofuran-2,3,4,5-tetracarboxylic acid dianhydride.

Other examples of the acid anhydride include aliphatic tetracarboxylic acid dianhydrides such as butanetetracarboxylic acid dianhydride.

It is necessary that the four carbonyl groups in the acid anhydride containing as its constituent $R_2$ in formula [I] or $R_4$ in formula [II] should not be attached directly to the aromatic ring in the case where the diamine containing as its constituent $R_1$ in formula [I] has a phenolic hydroxyl group and/or thiophenol group. So long as this requirement is met, the acid anhydrides are not specifically limited, and they may be the same or different and may be present alone or in combination with one another. Examples of the acid anhydride include the following alicyclic and aliphatic tetracarboxylic acid anhydrides.
1,2,3,4-cyclobutanetetracarboxylic acid dianhydride,
3,4-dicarboxy-1,2,3,4-tetrahydro-1-naphthalenesuccinic acid dianhydride,
2,3,5-tricarboxycyclopentylacetic acid dianhydride,
bicyclo(2.2.2)oct-7-ene-2,3,5,6-tetracarboxylic acid dianhydride,
tetrahydrofuran-2,3,4,5-tetracarboxylic acid dianhydride,
butanetetracarboxylic acid dianhydride.

Preferable among them from the standpoint of polyimide solubility are
1,2,3,4-cyclobutanetetracarboxylic acid dianhydride,
3,4-dicarboxy-1,2,3,4-tetrahydro-1-naphthalenesuccinic acid dianhydride,
2,3,5-tricarboxycyclopentylacetic acid dianhydride,
bicyclo(2.2.2)oct-7-ene-2,3,5,6-tetracarboxylic acid dianhydride,
tetrahydrofuran-2,3,4,5-tetracarboxylic acid dianhydride, For the production of a highly transparent polyimide resin (which is the second object of the present invention), 1,2,3,4-cyclobutanetetracarboxylic acid dianhydride is preferable.

The reaction between the acid anhydride and the diamine may be accomplished by any process which is not specifically limited. Usually, a tetracarboxylic acid dianhydride is reacted with a diamine in a polar solvent (such as N-methylpyrrolidone and dimethylformamide) to give a polyamic acid, followed by ring closure through dehydration. The reaction of a tetracarboxylic acid dianhydride with a diamine may be accomplished at a temperature in the range of $-20°$ to $150°$ C., preferably $-5°$ to $100°$ C.

The conversion of polyamic acid into polyimide may be accomplished by heating the polyamic acid in solution from at $150°-250°$ C. The dehydration for ring closure may be accomplished by azeotropic distillation with toluene or xylene.

A simple process for the conversion of polyamic acid into polyimide is the catalytic imidization. According to this process, imidization is accomplished by heating a solution of polyamic acid together with acetic anhydride and a tertiary amine (such as triethylamine, pyridine, isoquinoline, and imidazole) at any temperature in the range of $0°$ to $250°$ C. This process does not need heating, nor does it need complex steps to remove water formed by ring closure through dehydration. Therefore, it is known as an effective process for converting polyamic acid into polyimide. Unfortunately, this process cannot be applied to a polyimide resin containing hydroxyl groups because hydroxyl groups react with highly reactive acetic anhydride. (See Japanese Unexamined Patent Publication No. 33133/1989.) In the present invention, this process can be used only when the diamine containing as its constituent $R_1$ in formula [I] has one or more of at least one kind selected from the group consisting of carboxyl group and sulfonic group and has no phenolic hydroxyl group and thiophenol group.

According to the present invention, the molar percentage (a) of the repeating units represented by formula [I] should be in the range of 1 mol $\% \leq a \leq 90$ mol %. In the case where the acid anhydride containing as its constituent $R_2$ in formula [I] and $R_4$ in formula [II] has four carbonyl groups which are not attached directly to the aromatic ring, it should be in the range of 5 mol $\% \leq a \leq 50$ mol %, preferably 5 mol $\% \leq a \leq 20$ mol %.

With a small molar percentage (a), the polyimide resin composition needs the alkaline developing solution to be heated because the unexposed part is poor in solubility. This leads to a considerable decrease in film thickness in the unexposed part, which adversely affects the dimensional accuracy and prevents the good patterning.

With a large molar percentage (a), the polyimide resin composition does not provide a good pattern because the unexposed part is poor in resistance to the alkaline developing solution and hence the film thickness in the unexposed part remarkably decreases at the time of development. This drawback may be eliminated by adding a large amount of photosensitive substance;

but this is not desirable because the resulting polyimide resin is poor in heat resistance and electrical properties.

According to the present invention, the solvent-soluble polyimide should have a reduced viscosity of 0.05-3.0 dl/g, preferably 0.1-2.0 dl/g (measured at a concentration of 0.5 g/dl. in N-methylpyrrolidone at 30° C.). With a reduced viscosity lower than 0.05 dl/g, the polyimide causes the resulting composition to form a film having a low mechanical strength. With a reduced viscosity higher than 3.0 dl/g, the polyimide causes the resulting composition to increase in viscosity, extremely deteriorating its workability.

According to the present invention, the positive photosensitive polyimide composition contains as its constituent an o-quinonediazide compound. This compound is not specifically limited so long as it has an o-quinonediazide group in the molecule. Examples of the compound include o-benzoquinonediazide compounds, o-naphthoquinonediazide compounds, and o-quinolinediazide compounds. They are used for the so-called phenol novolak-type positive photosensitive composition. Most common among them are o-naphthoquinonediazide compounds. The o-quinonediazide compound is usually used in the form of o-quinonediazidesulfonic ester.

The o-quinonediazidesulfonic ester is usually obtained by the condensation reaction of o-quinonediazidesulfonic acid chloride with a compound having phenolic hydroxyl groups. The o-quinonediazidesulfonic acid chloride contains as its constituent o-quinonediazidesulfonic acid, which includes, for example, 1,2-naphthoquinone-2-diazide-4sulfonic acid and 1,2-naphthoquinone-2-diazide-5-sulfonic acid. The compound having phenolic hydroxyl groups includes, for example, 2,4-dihydroxybenzophenone,
2,3,4-trihydroxybenzophenone,
2,2′,4,4′-tetrahydroxybenzophenone,
2,3,4,4′-tetrahydroxybenzophenone,
2,2-bis(4-hydroxyphenyl)propane, and
4,4′-dihydroxydiphenylsulfone.

As the result of reaction, these compounds have the phenolic hydroxyl groups replaced partly or entirely by the o-quinonediazide sulfonic group, with the reaction product containing a mono-substitution product, di-substitution product, tri-substitution product, and tetra-substitution product. They may be used alone or in combination with one another.

According to the present invention, the o-quinonediazide compound should be used in an amount of 1-100 parts by weight for 100 parts by weight of the organic solvent-soluble polyimide. The amount should preferably be 5-50 parts by weight in the case where the acid anhydride containing as its constituent $R_2$ in formula [I] and $R_4$ in formula [II] has four carbonyl groups which are not attached directly to the aromatic ring. With an amount less than 1 part by weight, the o-quinonediazide compound does not give the composition a sufficient sensitivity required for patterning. With an amount in excess for 100 parts by weight, the o-quinonediazide compound causes the composition to form a film which is poor in mechanical and electrical properties.

The positive photosensitive polyimide composition of the present invention is used in the form of solution in an organic solvent for the production of electric and electronic devices. The organic solvent is not specifically limited so long as it uniformly dissolves the polyimide and o-quinonediazide compound. Examples of the organic solvent include N,N-dimethylformamide, N,N-dimethylacetamide, N-methylpyrrolidone, N-vinylpyrrolidone, dimethylsulfoxide, m-cresol, and γ-butyl lactone.

The above-mentioned organic solvent may be used in combination with other organic solvents, if necessary, so long as they have no adverse effect on the solubility of the composition. Examples of such organic solvents include ethyl cellosolve, butyl cellosolve, ethyl carbitol, butyl carbitol, diglyme, butyl lactone, and butyl carbitol acetate. The dissolution of the polyimide and o-quinonediazide compound may be accomplished by any process which is not specifically limited. One process consists of dissolving the o-quinonediazide compound in the solution in which the reaction and polymerization have been carried out to produce the organic solvent-soluble polyimide resin. Another process consists of dissolving in the above-mentioned organic solvent the organic solvent-soluble polyimide resin (which has been recovered by precipitation with a poor solvent) together with the o-quinonediazide compound.

The positive photosensitive polyimide resin composition may be dissolved in the organic solvent at any concentration which is not specifically limited so long as the polyimide resin and o-quinonediazide compound are uniformly dissolved in the organic solvent. An adequate concentration for easy application ranges from 1 to 50 wt %.

The positive photosensitive polyimide resin composition can be made into a film by spin coating onto a glass plate or silicon wafer, followed by preliminary drying at 50°-80° C. The film will firmly bond to the substrate if the substrate is treated with a silane coupling agent such as 3-aminopropyltriethoxysilane.

The thus formed film is exposed to light through a patterned mask and then developed with an alkaline developing solution to wash away the exposed part. In this way, there is obtained a relief pattern with sharp edges. The developing solution may be any alkaline solution which is not specifically limited. Examples of the alkaline solution include aqueous solution of alkali metal hydroxide (such as potassium hydroxide and sodium hydroxide), aqueous solutions of quaternary ammonium hydroxide (such as tetramethylammonium hydroxide, tetraethylammonium hydroxide, and choline), and aqueous solutions of amine (such as ethanolamine, propylamine, and ethylenediamine). The exposed part easily undergoes development at room temperature because of its high solubility.

The relief pattern formed on the substrate subsequently undergoes heat treatment at 200°-300° C. Thus there is obtained a patterned polyimide coating film having good heat resistance, chemical resistance, and electrical properties.

The positive photosensitive polyimide resin composition of the present invention has the positive photosensitive characteristics with high sensitivity and high resolution. In addition, it affords a coating film which easily undergoes etching with an alkaline aqueous solution. The coating film forms a fine, dimensionally accurate relief pattern when exposed through a patterned mask.

The positive photosensitive polyimide resin composition of the present invention may contain as its constituent the polyimide resin which can be produced easily by the catalytic imidization if it is a solvent-soluble polyimide resin having no phenolic hydroxide groups and thiophenol groups.

The positive photosensitive polyimide resin composition of the present invention has a high light transmittance as well as the positive photosensitive characteristics with high sensitivity and high resolution, in the case where the acid anhydride as a constituent of the polyimide-resin has four carbonyl groups which are not attached directly to the aromatic ring.

The positive photosensitive polyimide resin composition of the present invention will find use as layer insulating film for semiconductor elements, passivation film, and insulation film for multilayer printed circuit boards.

The present invention will be described in more detail with reference to the following examples, which are not intended to restrict the scope of the invention.

PREPARATION EXAMPLE 1

The following reactants were made to react with one another in 106 g of N-methylpyrrolidone (abbreviated as NMP hereinafter) at room temperature for 8 hours.

1.10 g of 2,2-bis(3-amino-4-hydroxyphenyl)hexafluoropropane (abbreviated as BAHF hereinafter).

11.68 g of bis[4-(3-aminophenoxy)phenyl]sulfone (abbreviated as BAPS hereinafter).

5.88 g of cyclobutanetetracarboxyoic acid dianhydride (abbreviated as CBDA hereinafter).

The reaction product was diluted with NMP so that the solution contained 10.0 wt % of solids. The solution was heated at 180° C. for 5 hours for ring closure through dehydration. Subsequently, the solution was poured into ethanol and the resulting precipitates were filtered and dried. Thus there was obtained about 18 g of slightly brownish powder. This powder gave an infrared spectrum having a peak at 1,780 cm$^{-1}$ attributable to the imide group. This powder (10 g) gave a uniform, clear solution when dissolved in NMP at a concentration of 15.0 wt % (solids). This powder gave a reduced viscosity of 0.25 dl/g measured at a concentration of 0.5 g/dl in NMP at 30° C.

PREPARATION EXAMPLE 2

The same procedure as in Preparation Example 1 was repeated to prepare an NMP solution of an organic solvent-soluble polyimide resin from 2.20 g of BAHF, 10.38 g of BAPS, 105 g of NMP, and 5.88 g of CBDA.

PREPARATION EXAMPLE 3

The same procedure as in Preparation Example 1 was repeated to prepare an NMP solution of an organic solvent-soluble polyimide resin from 1.30 g of 4,4'-diamino-3,3'-dihydroxybiphenyl (abbreviated as HAB hereinafter), 10.38 g of BAPS, 100 g of NMP, and 5.88 g of CBDA.

PREPARATION EXMAPLE 4

The same procedure as in Preparation example 1 was repeated to prepare an NMP solution of an organic solvent-soluble polyimide resin from 1.63 g of 4,4'-diamino-3,3'-dicarboxybiphenyl (abbreviated as CAB hereinafter), 10.38 g of BAPS, 101 g of NMP, and 5.88 g of CBDA.

PREPARATION EXAMPLE 5

The same procedure as in-Preparation Example 1 was repeated to prepare an NMP solution of an organic solvent-soluble polyimide resin from 12.98 g of BAPS, 107 g of NMP, and 5.88 g of CBDA.

PREPARATION EXAMPLE 6

The same procedure as in Preparation Example 1 was repeated to prepare an NMP solution of an organic solvent-soluble polyimide resin from 2.20 g of BAHF, 10.38 g of BAPS, 126 g of NMP, and 9.67 g of 3,3',4,4'-benzophenonetetracarboxylic acid dianhydride (abbreviated as BTDA hereinafter).

PREPARATION EXAMPLE 7

The same procedure as in Preparation Example 1 was repeated to prepare an NMP solution of an organic solvent-soluble polyimide resin from 2.20 g of BAHF, 10.38 g of BAPS, 143 g of NMP, and 12.61 g of 2,2'-bis(3,4-dicarboxylphenyl)hexafluoropropane dianhydride (abbreviated as 6FDA hereinafter).

PREPARATION EXAMPLE 8

The following reactants were made to react with one another in 92 g of NMP at room temperature for 8 hours.

1.37 g of 3,5-diaminaobenzoic acid (abbreviated as DBA hereinafter).

9.08 g of BAPS.

20 5.77 g of CBDA.

The reaction product was diluted with NMP so that the solution contained 7.0 wt % of solids. To the solution were added 24.7 g of acetic anhydride and 28.7 g of pyridine, followed by reaction at 40° C. for 30 minutes. The solution was poured into ethanol and the resulting precipitates were filtered and dried. Thus there was obtained about 14 g of slightly brownish powder. This powder gave an infrared spectrum having peaks at 1,780 cm$^{-1}$ and 800 cm$^{-1}$ attributable to the imide group. This powder gave an NMR spectrum which had no peaks attributable to the acetyl group. This powder gave a reduced viscosity of 0.56 dl/g measured at a concentration of 0.5 g/dl in NMP at 30° C.

PREPARATION EXAMPLE 9

The same procedure as in Preparation example 8 was repeated to prepare about 22 g of slightly brownish powder from 2.28 g of DBA, 6.49 g of BAPS, 125 g of NMP, and 13.3 g of 6FDA. This powder gave in infrared spectrum having peaks at 1,780 cm$^{-1}$ and 800 cm$^{-1}$ attributable to the imide group. This powder gave an NMR spectrum which had no peaks attributable to the acetyl group.

PREPARATION EXAMPLE 10

The same procedure as in Preparation Example 8 was repeated to prepare about 24 g of slightly brownish powder from 5.49 g of BAHF, 6.49 g of BAPS, 143 g of NMP, and 13.33 g of 6FDA. This powder gave an infrared spectrum having peaks at 1,780 cm$^{-1}$ and 800 cm$^{-1}$ attributable to the imide group. This powder gave an NMR spectrum which had a peak at 2.3 ppm attributable to the acetyl group. This indicates that the hydroxyl groups in the polyimide skeleton had been acetylated by acetic anhydride. This powder (10 g) gave a uniform, clear solution when dissolved in NMP at a concentration of 15.0 wt % (solids). This powder gave a reduced viscosity of 0.38 dl/g measured at a concentration of 0.5 g/dl in NMP at 30° C.

The results of the above-mentioned Preparation Examples are collectively shown in Table 1.

EXAMPLE 1

The positive photosensitive polyimide resin composition of the present invention was prepared in solution form from 30 g of the NMP solution of the organic solvent-soluble polyimide resin obtained in Preparation Example 1 and 0.67 g of naphthoquinone-type positive photosensitive agent (a compound formed by substituting 2,3,4,4'-tetrahydroxybenzophenone with 3 mol of 1,2-naphthoquinone-2-diazide-5-sulfonic acid), by stirring at room temperature for 3 hours. The mixture was filtered through a 1.0-$\mu$m filter to give the desired solution.

The thus obtained solution of the positive photosensitive polyimide resin composition was applied by spin coating to a substrate (silicon wafer with a thermally formed oxide film) which had been coated by spin coating with 0.1% ethanol solution of 3-aminopropyltriethoxysilane and then dried at 80° C. The coated substrate was dried in a circulating drying oven at 70° C. for 30 minutes. Thus there was obtained a 1.3-$\mu$m thick coating film.

This coating film was exposed to ultraviolet light for 2 minutes through a test mask using a UV light irradiating apparatus UVL-21 (made by UVP Corporation in the U.S.A.). The intensity of ultraviolet rays (350 nm) was 1.6 mW/cm$^2$ on the exposed surface (measured with a UV light meter "UV-MOL" made by Oak Seisakusho Co., Ltd.).

After exposure, the coating film was immersed in a developing solution (NMD-3 made by Tokyo Ouka Co., Ltd.) at 20° C. for 420 seconds, followed by washing with pure water. Thus there was obtained a positive relief pattern. The film thickness after development was 1.05 $\mu$m.

The relief pattern was baked in a circulating oven at 250° C. for 1 hour. Thus there was obtained a 0.88-$\mu$m thick polyimide resin film having a good relief pattern.

EXAMPLE 2

The same procedure as in Example 1 was repeated except that the composition was made from 100 parts by weight of the organic solvent-soluble polyimide resin in the form of NMP solution obtained in Preparation Example 1 and 30 parts by weight of the same positive photosensitive agent as used in Example 1. There was obtained a polyimide resin film having a good relief pattern.

EXAMPLE 3

The same procedure as in Example 1 was repeated except that the composition was made from 100 parts by weight of the organic solvent-soluble polyimide resin in the form of NMP solution obtained in Preparation Example 2 and 15 parts by weight of the same positive photosensitive agent as used in Example 1. There was obtained a polyimide resin film having a good relief pattern.

EXAMPLE 4

The same procedure as in Example 1 was repeated except that the composition was made from 100 parts by weight of the organic solvent-soluble polyimide resin in the form of NMP solution obtained in Preparation Example 2 and 25 parts by weight of the same positive photosensitive agent as used in example 1. There was obtained a polyimide resin film having a good relief pattern.

EXAMPLE 5

The same procedure as in Example 1 was repeated except that the composition was made from 100 parts by weight of the organic solvent-soluble polyimide resin in the form of NMP solution obtained in Preparation Example 3 and 15 parts by weight of the same positive photosensitive agent as used in Example 1. There was obtained a polyimide resin film having a good relief pattern.

EXAMPLE 6

The same procedure as in Example 1 was repeated except that the composition was made from 100 parts by weight of the organic solvent-soluble polyimide resin in the form of NMP solution obtained in Preparation Example 4 and 30 parts by weight of the same positive photosensitive agent as used in Example 1. There was obtained a polyimide resin film having a good relief pattern.

EXAMPLE 7

The same procedure as in Example 1 was repeated except that the composition was made from 100 parts by weight of the organic solvent-soluble polyimide resin in the form of NMP solution obtained in Preparation Example 8 and 30 parts by weight of the same positive photosensitive agent as used in Example 1. There was obtained a polyimide resin film having a good relief pattern.

EXAMPLE 8

The same procedure as in example 1 was repeated except that the composition was made from 100 parts by weight of the organic solvent-soluble polyimide resin in the form of NMP solution obtained in Preparation Example 9 and 50 parts by weight of the same positive photosensitive agent as used in Example 1. There was obtained a polyimide resin film having a good relief pattern.

COMPARATIVE EXAMPLE 1

The same procedure as in Example 1 was repeated except that the composition was made from 100 parts by weight of the organic solvent-soluble polyimide resin in the form of NMP solution obtained in Preparation Example 5 and 30 parts by weight of the same positive photosensitive agent as used in Example 1. The exposed part was not washed away at all by development and subsequent rinsing. Therefore, it was impossible to form a pattern in the coating film.

COMPARATIVE EXAMPLE 2

The same procedure as in Example 1 was repeated except that the composition was made from 100 parts by weight of the organic solvent-soluble polyimide resin in the form of NMP solution obtained in Preparation Example 6 and 30 parts by weight of the same positive photosensitive agent as used in Example 1. The exposed part was not washed away at all by development and subsequent rinsing. Therefore, it was impossible to form a pattern in the coating film.

COMPARATIVE EXAMPLE 3

The same procedure as in Example 1 was repeated except that the composition was made from 100 parts by weight of the organic solvent-soluble polyimide resin in the form of NMP solution obtained in Preparation Example 7 and 30 parts by weight of the same positive photosensitive agent as used in Example 1. The exposed part was not washed away at all by development and subsequent rinsing. Therefore, it was impossible to form a pattern in the coating film.

COMPARATIVE EXAMPLE 4

The same procedure as in Example 1 was repeated except that the composition was made from 100 parts by weight of the organic solvent-soluble polyimide resin in the form of NMP solution obtained in Preparation Example 10 and 50 parts by weight of the same positive photosensitive agent as used in Example 1. The exposed part was barely soluble in the developing solution. Therefore, it was impossible to form a pattern in the coating film.

The results of the above-mentioned Examples and Comparative Examples are collectively shown in Table 2.

TABLE 1

| Preparation Example No. | Acid anhydride | | Amine containing $R_1$ as a constituent | | Amine containing $R_3$ as a constituent | | Reduced viscosity* (dl/g) | Transmittance** (%) |
|---|---|---|---|---|---|---|---|---|
| | Name | Amount (g) | Name | Amount (g) | Name | Amount (g) | | |
| 1 | CBDA | 5.88 | BAHF | 1.10 | BAPS | 11.68 | 0.25 | 92 |
| 2 | CBDA | 5.88 | BAHF | 2.20 | BAPS | 10.38 | 0.28 | 91 |
| 3 | CBDA | 5.88 | HAB | 1.30 | BAPS | 10.38 | 0.42 | 86 |
| 4 | CBDA | 5.88 | CAB | 1.63 | BAPS | 10.38 | 0.22 | 88 |
| 5 | CBDA | 5.88 | — | — | BAPS | 12.98 | 0.49 | 92 |
| 6 | BTDA | 9.69 | BAHF | 2.20 | BAPS | 10.38 | 0.60 | 9 |
| 7 | 6FDA | 12.61 | BAHF | 2.20 | BAPS | 10.38 | 0.55 | 51 |
| 8 | CBDA | 5.88 | DBA | 1.37 | BAPS | 9.08 | 0.50 | 86 |
| 9 | 6FDA | 13.33 | DBA | 2.28 | BAPS | 6.49 | 0.60 | 46 |
| 10 | 6FDA | 13.33 | BAHF | 5.49 | BAPS | 6.49 | 0.61 | 48 |

*Measured in an NMP solution at a concentration of 0.5 g/dl at 30° C.
**Transmittance of UV light (350 nm) for 5-μm thick film.

TABLE 2

| Example & Comparative Example No. | Polyamide obtained in: | Photosensitive agent (pbw)* | Development (sec) | Film thickness (μm)** | | | | |
|---|---|---|---|---|---|---|---|---|
| | | | | Before development | Unexposed part after development | Exposed part after development | Unexposed part after baking | Exposed part after baking |
| Example 1 | Preparation Example 1 | 15 | 420 | 1.30 | 1.05 | 0 | 0.88 | 0 |
| Example 2 | Preparation Example 1 | 30 | 120 | 1.30 | 1.25 | 0 | 1.00 | 0 |
| Example 3 | Preparation Example 2 | 15 | 210 | 1.40 | 1.05 | 0 | 0.88 | 0 |
| Example 4 | Preparation Example 2 | 25 | 90 | 1.10 | 1.02 | 0 | 0.83 | 0 |
| Example 5 | Preparation Example 3 | 15 | 310 | 2.08 | 1.38 | 0 | 1.18 | 0 |
| Example 6 | Preparation Example 4 | 30 | 60 | 1.33 | 1.24 | 0 | 1.01 | 0 |
| Example 7 | Preparation Example 8 | 30 | 7 | 1.39 | 1.30 | 0 | 1.08 | 0 |
| Example 8 | Preparation Example 9 | 50 | 600 | 1.49 | 1.43 | 0 | 1.17 | 0 |
| Comparative Example 1 | Preparation Example 5 | 30 | 600 | 1.39 | 1.36 | 1.36 | 1.10 | 1.10 |
| Comparative Example 2 | Preparation Example 6 | 30 | 600 | 1.32 | 1.32 | 1.32 | 1.03 | 1.03 |
| Comparative Example 3 | Preparation Example 7 | 30 | 600 | 1.33 | 1.32 | 1.32 | 1.11 | 1.11 |
| Comparative Example 4 | Preparation Example 10 | 50 | 600 | 1.44 | 1.42 | 1.06 | 1.19 | 0.82 |

We claim:

1. A positive photosensitive polyimide resin composition which comprises 100 parts by weight of an organic solvent-soluble polyimide resin in admixture with 1–100 parts by weight of an o-quinonediazide compound, said polyimide resin being composed of the repeating units represented by formulas [I] and [II] below

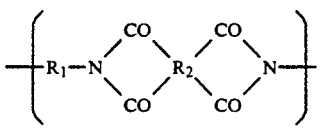

(I)

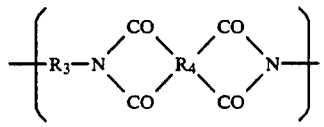

(II)

where $R_1$ is a divalent organic group to constitute a diamine which has one or more groups of at least one kind selected from the group consisting of phenolic hydroxyl group, carboxyl group, thiophenol group, and sulfonic group; $R_3$ is a divalent organic group having no phenolic hydroxyl group, carboxyl group, thiophenol group, or sulfonic group; and $R_2$ and $R_4$ each are a tetravalent organic group constituting a tetracarboxylic acid or a derivative thereof when $R_1$ has one or more groups of at least one kind selected from the group consisting of carboxyl group and sulfonic group and has no phenolic hydroxyl group or thiophenol group, or $R_2$ and $R_4$ each are a tetravalent organic group constituting an alicyclic or aliphatic tetracarboxylic acid or a derivative thereof when $R_1$ has one or more of a phenolic hydroxyl group or thiophenol group; with the molar percentage (a) of the repeating units represented by formula [I] being in the range of 1 mol % ≦ a ≦ 90 mol % and the molar percentage (b) of the repeating units represented by formula [II] being in the range of 10 mol % ≦ b ≦ 99 mol %, and having a reduced viscosity of 0.05–3.0 dl/g measured at a concentration of 0.5 g/dl in N-methylpyrrolidone at 30° C.

2. A positive photosensitive polyimide resin composition as claimed in claim 1, wherein the polyimide resin is composed of the repeating units represented by formulas [I] and [II] in which $R_1$ is a divalent organic group having one or more groups of at least one kind selected from the group consisting of carboxyl group and sulfonic group and having no phenolic hydroxyl group and thiophenol group; and $R_2$ and $R_4$ each are a tetravalent organic group which has at least one aromatic ring and constitutes a tetracarboxylic acid and a derivative thereof, with the four carbonyl groups being attached to the individual carbon atoms of the aromatic ring.

3. A positive photosensitive polyimide resin composition as claimed in claim 1, wherein the polyimide resin is composed of the repeating units represented by formulas [I] and [II] in which $R_1$ is a divalent organic group to constitute a diamine which has one or more groups of at least one kind selected from the group consisting of phenolic hydroxyl group, carboxyl group, thiophenol group, and sulfonic group; $R_3$ is a divalent organic group having no phenolic hydroxyl group, carboxyl group, thiophenol group, and sulfonic group; and $R_2$ and $R_4$ each are a tetravalent organic group which constitutes a tetracarboxylic acid and a derivative thereof composed of four carbonyl groups which are not attached directly to the aromatic ring.

4. A positive photosensitive polyimide resin composition as claimed in claim 3, wherein the polyimide resin composed of the repeating units represented by formulas [I] and [II] is an organic solvent-soluble polyimide resin which has a transmittance higher than 80% for light having a wavelength of 350 nm when it is in the form of 5-μm thick film.

5. A positive photosensitive polyimide resin composition as claimed in claim 4, wherein the polyimide resin is composed of the repeating units represented by formulas [I] and [II], with the molar percentage (a) of the repeating units represented by formula [I] being in the range of 5 mol % $\leq$ a $\leq$ 50 mol % and the molar percentage (b) of the repeating units represented by formula [II] being in the range of 50 mol % $\leq$ b $\leq$ 95 mol %.

6. A positive photosensitive polyimide resin composition as claimed in claim 4, wherein the polyimide resin is composed of the repeating units represented by formulas [I] and [II], with the molar percentage (a) of the repeating units represented by formula [I] being in the range of 5 mol % $\leq$ a $\leq$ 20 mol % and the molar percentage (b) of the repeating units represented by formula [II] being in the range of 80 mol % $\leq$ b $\leq$ 95 mol %.

7. A positive photosensitive polyimide resin composition as claimed in claim 4, wherein the polyimide resin is composed of the repeating units represented by formulas [I] and [II] in which $R_2$ and $R_4$ each are a cyclobutadiene residue.

8. A positive photosensitive polyimide resin composition as claimed in claim 5, wherein the polyimide resin is composed of the repeating units represented by formulas [I] and [II] in which $R_2$ and $R_4$ each are a cyclobutadiene residue.

9. A positive photosensitive polyimide resin composition as claimed in claim 6, wherein the polyimide resin is composed of the repeating units represented by formulas [I] and [II] in which $R_2$ and $R_4$ each are a cyclobutadiene residue.

10. A positive photosensitive polyimide resin composition as claimed in claim 4, which comprises 100 parts by weight of an organic solvent-soluble polyimide resin specified in claim 4 and 5-50 parts by weight of an o-quinonediazide compound.

11. A positive photosensitive polyimide resin composition as claimed in claim 5, which comprises 100 parts by weight of an organic solvent-soluble polyimide resin specified in claim 5 and 5-50 parts by weight of an o-quinonediazide compound.

12. A positive photosensitive polyimide resin composition as claimed in claim 6, which comprises 100 parts by weight of an organic solvent-soluble polyimide resin specified in claim 6 and 5-50 parts by weight of an o-quinonediazide compound.

13. A positive photosensitive polyimide resin composition as claimed in claim 7, which comprises 100 parts by weight of an organic solvent-soluble polyimide resin specified in claim 7 and 5-50 parts by weight of an o-quinonediazide compound.

14. A positive photosensitive polyimide resin composition as claimed in claim 8, which comprises 100 parts by weight of an organic solvent-soluble polyimide resin specified in claim 8 and 5-50 parts by weight of an o-quinonediazide compound.

15. A positive photosensitive polyimide resin composition as claimed in claim 9, which comprises 100 parts by weight of an organic solvent-soluble polyimide resin specified in claim 9 and 5-50 parts by weight of an o-quinonediazide compound.

* * * * *